United States Patent
Jo et al.

(10) Patent No.: US 12,132,133 B2
(45) Date of Patent: Oct. 29, 2024

(54) AVALANCHE PHOTODETECTORS AND IMAGE SENSORS INCLUDING THE SAME

(71) Applicant: Samsung Electronics Co., Ltd., Suwon-si (KR)

(72) Inventors: Sanghyun Jo, Seoul (KR); Jaeho Lee, Seoul (KR); Haeryong Kim, Seongnam-si (KR); Hyeonjin Shin, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 18/338,631

(22) Filed: Jun. 21, 2023

(65) Prior Publication Data

US 2023/0335665 A1    Oct. 19, 2023

Related U.S. Application Data

(63) Continuation of application No. 17/857,466, filed on Jul. 5, 2022, now Pat. No. 11,721,781, which is a
(Continued)

(30) Foreign Application Priority Data

Nov. 23, 2017    (KR) .......................... 10-2017-0157506

(51) Int. Cl.
*H01L 29/66*    (2006.01)
*G01S 7/481*    (2006.01)
(Continued)

(52) U.S. Cl.
CPC ........ *H01L 31/1075* (2013.01); *G01S 7/4816* (2013.01); *G01S 7/4817* (2013.01);
(Continued)

(58) Field of Classification Search
CPC .......... H01L 31/1075; H01L 31/02027; H01L 31/022466; H01L 31/03529; H01L 31/028;
(Continued)

(56) References Cited

U.S. PATENT DOCUMENTS 5,552,629 A *    9/1996   Watanabe ........... H01L 31/1075
                                                      257/438
7,999,020 B2 *   8/2011   Frisbie .................. C08F 297/02
                                                       257/40
(Continued)

FOREIGN PATENT DOCUMENTS

CN    106409957 A    2/2017
KR    100463416 B1   12/2004
(Continued)

OTHER PUBLICATIONS

J. O. D. Williams et al., "Towards a Graphene-Based Low Intensity Photon Counting Photodetector", Sensors, 16.9 (2016); 1351.
(Continued)

*Primary Examiner* — Sheikh Maruf
(74) *Attorney, Agent, or Firm* — Harness, Dickey & Pierce, P.L.C.

(57) ABSTRACT

A photodetector having a small form factor and having high detection efficiency with respect to both visible light and infrared rays may include a first electrode, a collector layer on the first electrode, a tunnel barrier layer on the collector layer, a graphene layer on the tunnel barrier layer, an emitter layer on the graphene layer, and a second electrode on the emitter layer. The photodetector may be included in an image sensor. An image sensor may include a substrate, an insulating layer on the substrate, and a plurality of photodetectors on the insulating layer. The photodetectors may be aligned with each other in a direction extending parallel or
(Continued)

perpendicular to a top surface of the insulating layer. The photodetector may be included in a LiDAR system.

12 Claims, 12 Drawing Sheets

Related U.S. Application Data continuation of application No. 15/942,659, filed on Apr. 2, 2018, now Pat. No. 11,417,790.

(51) Int. Cl.
| | |
|---|---|
| G01S 17/931 | (2020.01) |
| H01L 27/146 | (2006.01) |
| H01L 31/02 | (2006.01) |
| H01L 31/0224 | (2006.01) |
| H01L 31/028 | (2006.01) |
| H01L 31/032 | (2006.01) |
| H01L 31/0352 | (2006.01) |
| H01L 31/101 | (2006.01) |
| H01L 31/107 | (2006.01) |
| H01S 5/0687 | (2006.01) |
| H10K 39/32 | (2023.01) |
| G05D 1/00 | (2006.01) |
| H01L 31/0256 | (2006.01) |
| H01L 31/0296 | (2006.01) |
| H01L 31/0304 | (2006.01) |
| H01L 31/0312 | (2006.01) |

(52) U.S. Cl.
CPC ...... *G01S 17/931* (2020.01); *H01L 27/14643* (2013.01); *H01L 27/14647* (2013.01); *H01L 31/02027* (2013.01); *H01L 31/022466* (2013.01); *H01L 31/028* (2013.01); *H01L 31/032* (2013.01); *H01L 31/035209* (2013.01); *H01L 31/035281* (2013.01); *H01L 31/03529* (2013.01); *H01L 31/1013* (2013.01); *H01S 5/0687* (2013.01); *H10K 39/32* (2023.02); *G05D 1/024* (2013.01); *H01L 31/0296* (2013.01); *H01L 31/0304* (2013.01); *H01L 31/0312* (2013.01); *H01L 31/0324* (2013.01); *H01L 2031/0344* (2013.01); *H01L 31/035218* (2013.01)

(58) Field of Classification Search
CPC ........... H01L 27/14643; H01L 31/0304; H01L 31/0296; H01L 31/0324; H01S 5/0687
USPC .............................................. 365/5; 257/186
See application file for complete search history.

(56) References Cited

U.S. PATENT DOCUMENTS

| | | | | |
|---|---|---|---|---|
| 9,570,694 | B2* | 2/2017 | Sajed | H10K 10/464 |
| 9,620,434 | B1 | 4/2017 | Joshi et al. | |
| 10,121,932 | B1* | 11/2018 | Torres, Jr. | C09K 11/65 |
| 10,381,506 | B1* | 8/2019 | Torres, Jr. | H01L 33/26 |
| 2002/0074555 | A1 | 6/2002 | Kim et al. | |
| 2004/0046176 | A1 | 3/2004 | Kim et al. | |
| 2005/0073039 | A1 | 4/2005 | Kasuya et al. | |
| 2005/0258449 | A1* | 11/2005 | Lutz | H01L 31/107 |
| | | | | 257/E31.063 |
| 2006/0151871 | A1 | 7/2006 | Mehrotra | |
| 2007/0205253 | A1 | 9/2007 | Hubner | |
| 2008/0121867 | A1* | 5/2008 | Yagyu | H01L 31/03529 |
| | | | | 257/E31.039 |
| 2008/0217603 | A1 | 9/2008 | Takeda et al. | |
| 2008/0230862 | A1 | 9/2008 | Singh | |
| 2009/0142558 | A1* | 6/2009 | Jiao | B82Y 30/00 |
| | | | | 428/206 |
| 2009/0152681 | A1* | 6/2009 | Zheng | G01J 1/42 |
| | | | | 257/E29.327 |
| 2009/0256223 | A1* | 10/2009 | Yamamura | H01L 31/107 |
| | | | | 257/E31.037 |
| 2010/0140642 | A1* | 6/2010 | Arai | H05B 33/14 |
| | | | | 257/101 |
| 2010/0272140 | A1 | 10/2010 | Walter et al. | |
| 2011/0020582 | A1 | 1/2011 | Kojima et al. | |
| 2011/0309335 | A1 | 12/2011 | Mehr et al. | |
| 2012/0068157 | A1 | 3/2012 | Kub | |
| 2012/0112201 | A1 | 5/2012 | Otsuka et al. | |
| 2012/0141799 | A1* | 6/2012 | Kub | H01L 31/072 |
| | | | | 977/734 |
| 2012/0313252 | A1 | 12/2012 | Ueda et al. | |
| 2013/0146836 | A1 | 6/2013 | Kastalsky | |
| 2014/0027715 | A1* | 1/2014 | Mehr | H01L 29/1606 |
| | | | | 257/29 |
| 2014/0284552 | A1 | 9/2014 | Kub et al. | |
| 2014/0327037 | A1* | 11/2014 | Dussaigne | H01L 21/0254 |
| | | | | 257/431 |
| 2015/0008253 | A1 | 1/2015 | Yoon et al. | |
| 2015/0041762 | A1 | 2/2015 | Kub | |
| 2015/0281620 | A1* | 10/2015 | Usuda | H01L 27/14609 |
| | | | | 257/438 |
| 2015/0364589 | A1* | 12/2015 | Lee | H01L 21/28512 |
| | | | | 257/29 |
| 2016/0284811 | A1* | 9/2016 | Yu | H01L 21/28506 |
| 2016/0372615 | A1 | 12/2016 | Yang et al. | |
| 2017/0033263 | A1* | 2/2017 | Park | H01L 33/06 |
| 2017/0125557 | A1 | 5/2017 | Kub et al. | |
| 2017/0236968 | A1 | 8/2017 | Heo et al. | |
| 2017/0263686 | A1 | 9/2017 | Beiley et al. | |
| 2018/0374972 | A1* | 12/2018 | Mena | H01L 31/1013 |
| 2019/0157479 | A1* | 5/2019 | Nobusa | H01L 31/107 |
| 2019/0157491 | A1* | 5/2019 | Jo | H01L 31/1075 |
| 2019/0333838 | A1* | 10/2019 | Nawaz | H01L 23/62 |

FOREIGN PATENT DOCUMENTS

| | | |
|---|---|---|
| KR | 20140110473 A | 9/2014 |
| KR | 10-2017-0095597 A | 8/2017 |

OTHER PUBLICATIONS

X. Li et al., "A self-powered graphene-MoS2 hybrid phototransistor with fast resonse rate and high on-off ratio", Carbon 92, p. 126-132, 2015.
S. Goossens et al., "Broadband image sensor array based on graphene—CMOS integration", Nature Photonics, 11.6, Jun. 2017; 366.
Slideshow: https://www.slideshare.net/AakankshaR/photodetectors-44130584.
S.I. Baranchuk et al., "The Influence of Strong Electric Field on the Interface in the Al—SiO2 -n-Si Auger Transistor", PROC. 22nd International Conference on Microelectronics (MIEL 2000), vol. 1, pp. 153-157, May 14-17, 2000.
S. Lei et al., "An Atomically Layered InSe Avalance Photodetector", ACS Publications, American Chemical Society, Nano Letters, vol. 15, pp. 3048-3055, 2015.
O. Lopez-Sanchez et al., "Avalanche photodiodes based on MoS2/Si heterojunctions", pp. 1-8, 2014, https://arxiv.org/ftp/arxiv/papers/1411/1411.3232.pdf.
I. Goykhman et al., "High Responsivity Silicon-Graphene Schottky Avalanche Photodetectors for Visible and Telecom Wavelengths", CLEO: Science and Innovations, Optical Society of America, 2015.
Extended European Search Report dated Jan. 7, 2019 for corresponding European Application No. 18171541.8.
X. Li et al., "High Detectivity Graphene-Silicon Heterjunction Photodetector", Small, vol. 12. No. 5, pp. 595-601, 2016.
Y. Lu et al., "ZnO quantum dot-doped graphene/h-BN/GaN-heterostructure ultraviolet photodetector with extremely high responsivity", Letters, Nanotechnology, vol. 27, 48LT03 pp. 1-7, 2016.

(56) References Cited

OTHER PUBLICATIONS

Korean Office Action dated May 18, 2022 for corresponding Korean Application No. 10-2017-0157506, and English-language translation thereof.

Chinese Office Action dated Jul. 18, 2023 for corresponding Chinese Application No. 201810538676.4, and English-language translation thereof.

\* cited by examiner

AVALANCHE PHOTODETECTORS AND IMAGE SENSORS INCLUDING THE SAME

CROSS-REFERENCE TO RELATED APPLICATIONS

This application is a continuation of U.S. application Ser. No. 17/857,466, filed Jul. 5, 2022, which is a continuation of U.S. application Ser. No. 15/942,659, filed Apr. 2, 2018, which claims the benefit, under 35 U.S.C. § 119, of Korean Patent Application No. 10-2017-0157506, filed on Nov. 23, 2017, in the Korean Intellectual Property Office, the disclosure of each of which is incorporated herein in its entirety by reference.

BACKGROUND

1. Field

Example embodiments set forth herein relate to avalanche photodetectors and image sensors including the same, and more particularly, to avalanche photodetectors configured to utilize a photo-doping effect associated with graphene and image sensors including said avalanche photodetectors.

2. Description of the Related Art

Silicon-based complementary metal oxide semiconductor (CMOS) image sensors are the most common image sensors. However, silicon generally used in photodetectors and image sensors has significantly lower quantum efficiency with respect to an infrared band ("infrared wavelength spectrum of light") than the lower quantum efficiency of the silicon with respect to a visible-light band ("visible wavelength spectrum of light"). Recently, as near-infrared (NIR) rays of a wavelength band (e.g., a "near-infrared wavelength spectrum of light") of about 800 nm to about 900 nm have been used in biometric sensors, low-light sensitivity enhancement equipment, night glasses, autonomous sensors such as light detection and ranging (LiDAR) systems, three-dimensional (3D) sensors, etc., the importance of photodetectors or image sensors capable of sensing infrared rays ("infrared wavelength spectra of light") as well as visible light ("visible wavelength spectra of light") is increasing. Furthermore, it is important for infrared photodetectors to be manufactured with a small form factor so that they can be applied to smartphones or wearable devices.

SUMMARY

According to an aspect of some example embodiments, a photodetector includes a first electrode, a collector layer on the first electrode, a tunnel barrier layer on the collector layer, a graphene layer on the tunnel barrier layer, an emitter layer on the graphene layer, and a second electrode on the emitter layer.

In some example embodiments, the photodetector may have a small form factor (e.g., may be relatively compact), such that the photodetector is configured to be included in relatively small electronic devices, including smartphones and/or wearable devices.

The first electrode may at least partially include a conductive metal material.

The collector layer may include a first semiconductor material, and the emitter layer may include a second semiconductor material.

Each semiconductor material of the first semiconductor material and the second semiconductor material includes silicon (Si), germanium (Ge), an organic semiconductor, a compound semiconductor, quantum dots, or a two-dimensional (2D) crystal having a band gap.

At least one semiconductor material of the first semiconductor material and the second semiconductor material may include the 2D crystal having the band gap, and the 2D crystal having the band gap may include a transition metal dichalcogenide which is a compound of a transition metal and a chalcogen element.

For example, the transition metal dichalcogenide may include at least one selected from a group consisting of MoS2, WS2, TaS2, HfS2, ReS2, TiS2, NbS2, SnS2, MoSe2, WSe2, TaSe2, HfSe2, ReSe2, TiSe2, NbSe2, SnSe2, MoTe2, WTe2, TaTe2, HfTe2, ReTe2, TiTe2, NbTe2, and SnTe2.

At least one semiconductor material of the first semiconductor material and the second semiconductor material includes the 2D crystal having the band gap, and the 2D crystal having the band gap may further include at least one selected from a group consisting of TiOx, NbOx, MnOx, VaOx, MnO3, TaO3, WO3, MoCl2, CrCl3, RuCl3, BiI3, PbCl4, GeS, GaS, GeSe, GaSe, PtSe2, In2Se3, GaTe, InS, InSe, and InTe.

The tunnel barrier layer may include an insulating material, the insulating material having a thickness that is at least a minimum thickness of the insulating material associated with tunneling of electrons and holes in the tunnel barrier layer.

The tunnel barrier layer may include at least one selected from a group consisting of SiO2, SiN, Al2O3, HfO2, and hexagonal BN (h-BN).

The second electrode may include a transparent conductive material.

For example, the graphene layer may include single-layer graphene or multi-layer graphene, and the graphene layer may have a thickness of about 0.3 nm to about 1 μm.

For example, the emitter layer and the tunnel barrier layer may each have a thickness of about 0.3 nm to about 1 μm.

According to an aspect of some example embodiments, an image sensor includes a substrate, an insulating layer on the substrate, a first electrode on the insulating layer, a first photodetector on the first electrode, and a second photodetector on the first photodetector. Each photodetector of the first photodetector and the second photodetector includes a collector layer, a tunnel barrier layer on the collector layer, a graphene layer on the tunnel barrier layer, an emitter layer on the graphene layer, and a second electrode on the emitter layer.

The collector layer and the emitter layer of each photodetector of the first photodetector and the second photodetector may include a semiconductor material.

The emitter layer of the first photodetector and the emitter layer of the second photodetector may include semiconductor materials having different band gaps, respectively.

According to an aspect of some example embodiments, an image sensor includes a substrate, an insulating layer on the substrate; and a first photodetector and a second photodetector separately on the insulating layer and aligned with each other in a direction that is parallel to a top surface of the insulating layer. Each photodetector of the first and second photodetectors may include a first electrode on the insulating layer, a collector layer on the first electrode, a tunnel barrier layer on the collector layer, a graphene layer on the tunnel barrier layer, an emitter layer on the graphene layer, and a second electrode on the emitter layer.

The collector layer and the emitter layer of each photodetector of the first photodetector and the second photodetector may include a semiconductor material.

The emitter layer of the first photodetector and the emitter layer of the second photodetector may include semiconductor materials having different band gaps, respectively.

According to an aspect of some example embodiments, an image sensor may include a substrate, an insulating layer on the substrate, and a first photodetector and a second photodetector on the insulating layer. At least one photodetector of the first and second photodetectors may include a first electrode on the insulating layer, a collector layer on the first electrode, a tunnel barrier layer on the collector layer, a graphene layer on the tunnel barrier layer, an emitter layer on the graphene layer, and a second electrode on the emitter layer.

The first photodetector and the second photodetector may be separately on the insulating layer and aligned with each other in a direction that is parallel to a top surface of the insulating layer.

The collector layer and the emitter layer of each photodetector of the first photodetector and the second photodetector may include a semiconductor material.

The emitter layer of the first photodetector and the emitter layer of the second photodetector may include semiconductor materials having different band gaps, respectively.

According to an aspect of some example embodiments, a light detection and ranging (LiDAR) system may include a wavelength-tunable laser diode (LD) configured to emit a light beam, an optical phased array (OPA) configured to receive the emitted light beam as an input optical signal and output an optical signal into an environment based on receiving the input optical signal from the LD, a receiver configured to receive an optical signal output from the OPA and reflected from an object, and a controller configured to control the wavelength-tunable LD, the OPA, and the receiver. The receiver may include at least one photodetector, the at least one photodetector including a first electrode, a collector layer on the first electrode, a tunnel barrier layer on the collector layer, a graphene layer on the tunnel barrier layer, an emitter layer on the graphene layer, and a second electrode on the emitter layer.

The LiDAR system may be configured to be included in a vehicle, such that the LiDAR system is configured to enable the vehicle to be autonomously navigated in relation to the object based at least in part upon data generated by the LiDAR system.

The controller may include an LD controller configured to control light emitted by the wavelength-tunable LD, a vertical angle controller configured to control a vertical angle of the optical signal based on adjusting a wavelength of the wavelength-tunable LD, a horizontal angle controller configured to control a horizontal angle of the optical signal based on adjusting the OPA, and a main controller configured to control the LD controller, the vertical angle controller, the horizontal angle controller, and the receiver.

The wavelength-tunable LD, the OPA, and the receiver may be integrated in a bulk-silicon substrate, such that the wavelength-tunable LD, the OPA, and the receiver collectively comprise an optical integrated circuit.

The controller may be one of a device integrated in the bulk-silicon substrate, and a separate chip coupled to the optical integrated circuit.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
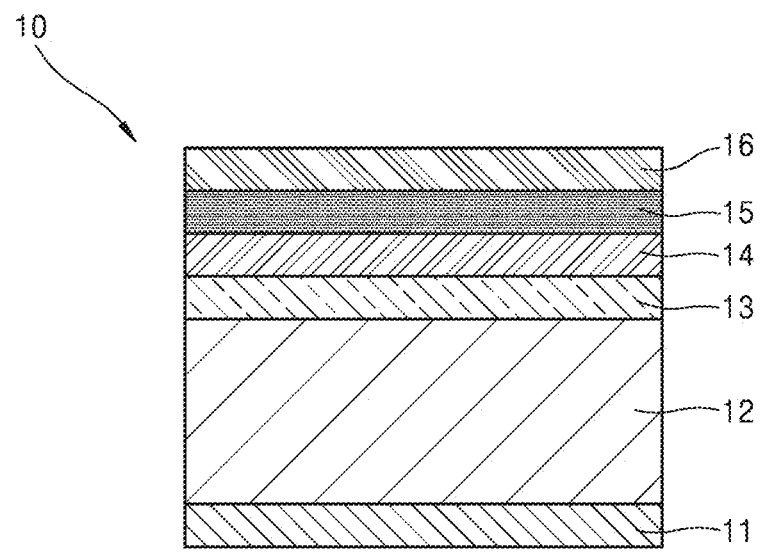
FIG. 1 is a schematic cross-sectional view of an avalanche photodetector according to some example embodiments.

Hereinafter, avalanche photodetectors and image sensors including the same will be described in detail with reference to the accompanying drawings. In the drawings, the same reference numerals represent the same elements, and the size of each component may be exaggerated for clarity. Embodiments set forth herein are merely examples and various changes may be made therein. In the following description, when in each layer structure, an element is referred to as being "on" another element should be understood to mean that the element is disposed on, below, at a left side or at a right side of the other element while being in contact with the other element or while not being in contact with the other element. As used herein, expressions such as "at least one of," when preceding a list of elements, modify the entire list of elements and do not modify the individual elements of the list.

Furthermore, when an element is referred to as being "on" another element, it will be understood that the element may be above or below the other element. An element that is "on" another element may be "directly on" the other element (e.g., in direct contact with the other element) or may be "indirectly on" the other element (e.g., a third element may interpose between the element and the other element).

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Additionally, the terms "comprising," "comprises," "including," and "includes" may be used interchangeably herein.

FIG. 1 is a schematic cross-sectional view of an avalanche photodetector 10 according to some example embodiments. Referring to FIG. 1, the avalanche photodetector 10 according to some example embodiments may include a collector layer 12 formed of ("at least partially comprising") a semiconductor material, a tunnel barrier layer 13 having an insulating property and disposed ("located") on an upper surface of the collector layer 12, a graphene layer 14 disposed on an upper surface of the tunnel barrier layer 13, and an emitter layer 15 formed of a semiconductor material and disposed on an upper surface of the graphene layer 14. The avalanche photodetector 10 may further include a lower electrode 11 (also referred to herein as a first electrode) disposed on a lower surface of the collector layer 12, and an upper electrode 16 (also referred to herein as a second electrode) disposed on an upper surface of the emitter layer 15. Thus, as shown in at least FIG. 1, the avalanche photodetector 10 may include a first electrode (lower electrode 11), a collector layer 12 on the first electrode, a tunnel barrier layer 13 on the collector layer 12, a graphene layer 14 on the tunnel barrier layer, an emitter layer 15 on the graphene layer, and a second electrode (upper electrode 16) on the emitter layer 15.

The emitter layer 15 may function as ("may be configured to function as") a light absorbing layer which absorbs light and generates electron-hole pairs. Restated, the emitter layer 15 may be configured to absorb light and generate electrode-hole pairs. The collector layer 12 may absorb electrons or holes generated by the emitter layer 15. Furthermore, the collector layer 12 may collide with electrons or holes accelerated at a high electric field ("high-intensity electric field") (e.g., accelerated based on the high-intensity electric field) and may generate a large amount of electrons and holes. In other words, an avalanche phenomenon may occur in the collector layer 12. The emitter layer 15 and the collector layer 12 may be formed of ("may at least partially comprise") any semiconductor material having ("associated with") a band gap. Particularly, a wavelength band of light ("wavelength spectrum of light") absorbed by the emitter layer 15 may vary (e.g., may vary in wavelength spectrum) according to the band gap of the semiconductor material of the emitter layer 15. The emitter layer 15 and the collector layer 12 may be formed of the same semiconductor material or different semiconductor materials. Restated, the collector layer 12 may include a first semiconductor material and the emitter layer 15 may include a second semiconductor material, where the first and second semiconductor materials may be a common semiconductor material or may be different semiconductor materials. In some example embodiments, the emitter layer 15 and the collector layer 12 may be each formed of ("may at least partially comprise") a doped semiconductor material or a non-doped semiconductor material.

For example, the semiconductor material (e.g., the first semiconductor material and/or the second semiconductor material) may include at least one selected from the group consisting of a Group IV semiconductor such as silicon (Si) or germanium (Ge), a Group III-V compound semiconductor such as GaAs or GaP, a Group II-VI compound semiconductor such as CdS or ZnTe, a Group IV-VI compound semiconductor such as PbS, a Group IV-IV compound semiconductor such as SiC, an oxide semiconductor such as IGZO, quantum dots, an organic semiconductor, and a two-dimensional (2D) crystal semiconductor having a band gap. Restated, each semiconductor material of the first semiconductor material and the second semiconductor material may include silicon (Si), germanium (Ge), an organic semiconductor, a compound semiconductor, quantum dots, or a two-dimensional (2D) crystal having a band gap. A representative example of the 2D crystal semiconductor is transition metal dichalcogenide (TMD) which is a compound of a transition metal and a chalcogen element. Restated, at least one semiconductor material of the first semiconductor material and the second semiconductor material may include a 2D crystal having a band gap, and the 2D crystal having the band gap may include a transition metal dichalcogenide which is a compound of a transition metal and a chalcogen element. Examples of the transition metal dichalcogenide (TMD) may include $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$. Examples of the other 2D crystal semiconductor besides the TMD may further include $TiO_x$, $NbO_x$, $MnO_x$, $VaO_x$, $MnO_3$, $TaO_3$, $WO_3$, $MoCl_2$, $CrCl_3$, $RuCl_3$, $BiI_3$, $PbCl_4$, GeS, GaS, GeSe, GaSe, $PtSe_2$, $In_2Se_3$, GaTe, InS, InSe, InTe, etc. Restated, at least one semiconductor material of the first semiconductor material and the second semiconductor material includes the 2D crystal having the band gap, and the 2D crystal having the band gap may further include at least one selected from a group consisting of $TiO_x$, $NbO_x$, $MnO_x$, $VaO_x$, $MnO_3$, $TaO_3$, $WO_3$, $MoCl_2$, $CrCl_3$, $RuCl_3$, $BiI_3$, $PbCl_4$, GeS, GaS, GeSe, GaSe, $PtSe_2$, $In_2Se_3$, GaTe, InS, InSe, and InTe.

A thickness of the collector layer 12 is not limited provided that electrons can be sufficiently absorbed. The emitter layer 15 may have a thickness of about 0.3 nm to about 1 μm to be configured to efficiently absorb light and easily move electrons and holes.

The tunnel barrier layer 13 is formed to have a band gap very higher than that of the collector layer 12 to cause the avalanche phenomenon to occur. To this end, the tunnel barrier layer 13 may be formed of ("may at least partially comprise") an insulating material having a thickness sufficient for achieving tunneling of electrons and holes. Restated, the tunnel barrier layer 13 may include an insulating material having a thickness that at least meets a first threshold thickness, wherein the first threshold thickness is a minimum thickness of the insulating material associated with tunneling of electrons and holes in the tunnel barrier layer 13. For example, the tunnel barrier layer 13 may be formed of an insulating material such as $SiO_2$, SiN, $Al_2O_3$, or $HfO_2$. In some example embodiments, the tunnel barrier layer 13 may be formed of a 2D insulating material such as hexagonal BN (h-BN). The h-BN has a hexagonal crystal structure in which boron (B) and nitrogen (N) are bound to each other. The tunnel barrier layer 13 may have a thickness of about 0.3 nm to about 1 μm to be configured to achieve tunneling.

The graphene layer 14 is disposed between the tunnel barrier layer 13 and the emitter layer 15. The graphene layer 14 may be configured to suppress dark current. Furthermore, the graphene layer 14 may cause a photo-doping effect to occur (e.g., may be configured to induce a photo-doping effect) due to ("based on") electrons or holes generated by the emitter layer 15 when light is incident on the avalanche photodetector 10, so that the electrons or holes generated by the emitter layer 15 may easily move to the collector layer 12 via the tunnel barrier layer 13. The graphene layer 14 may be formed of ("may at least partially include") single-layer graphene or multi-layer graphene. For example, the graphene layer 14 may have a thickness of about 0.3 nm to about 1 μm.

The lower electrode 11 may be formed of a conductive metal material (e.g., an electrically conductive metal material, a thermally conductive metal material, some combination thereof, or the like). For example, the lower electrode 11 may be formed of a metal, such as magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), or bismuth (Bi), or an alloy thereof.

The upper electrode 16 may be formed of ("may at least partially comprise") a transparent conductive material so that the upper electrode 16 may be configured to enable light (e.g., infrared wavelength spectra of light, visible wavelength spectra of light, ultraviolet wavelength spectra of light, some combination thereof, or the like) to be transmitted therethrough. For example, the upper electrode 16 may be formed of a transparent conductive oxide such as ITO, IZO, or ZnO, or graphene.

Figure 2:
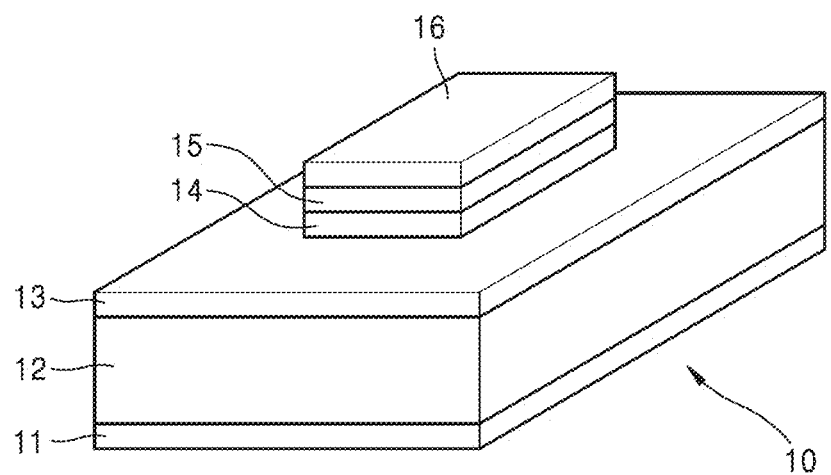
FIG. 2 is a schematic perspective view of an avalanche photodetector according to some example embodiments.

FIG. 2 is a schematic perspective view of an avalanche photodetector 10 according to some example embodiments. FIG. 1 illustrates that all of the lower electrode 11, the collector layer 12, the tunnel barrier layer 13, the graphene layer 14, the emitter layer 15, and the upper electrode 16 have the same area ("have a common surface area extending parallel to the layers"). In contrast, the tunnel barrier layer 13, the graphene layer 14, the emitter layer 15, and the upper electrode 16 may be sequentially formed on, for example, a silicon wafer, and may be thereafter patterned by etching the graphene layer 14, the emitter layer 15, and the upper electrode 16. Thus, as illustrated in FIG. 2, the graphene layer 14, the emitter layer 15, and the upper electrode 16 may have areas smaller than those of the other layers. In this case, the silicon wafer may be configured to function as the collector layer 12.

Figure 3A:
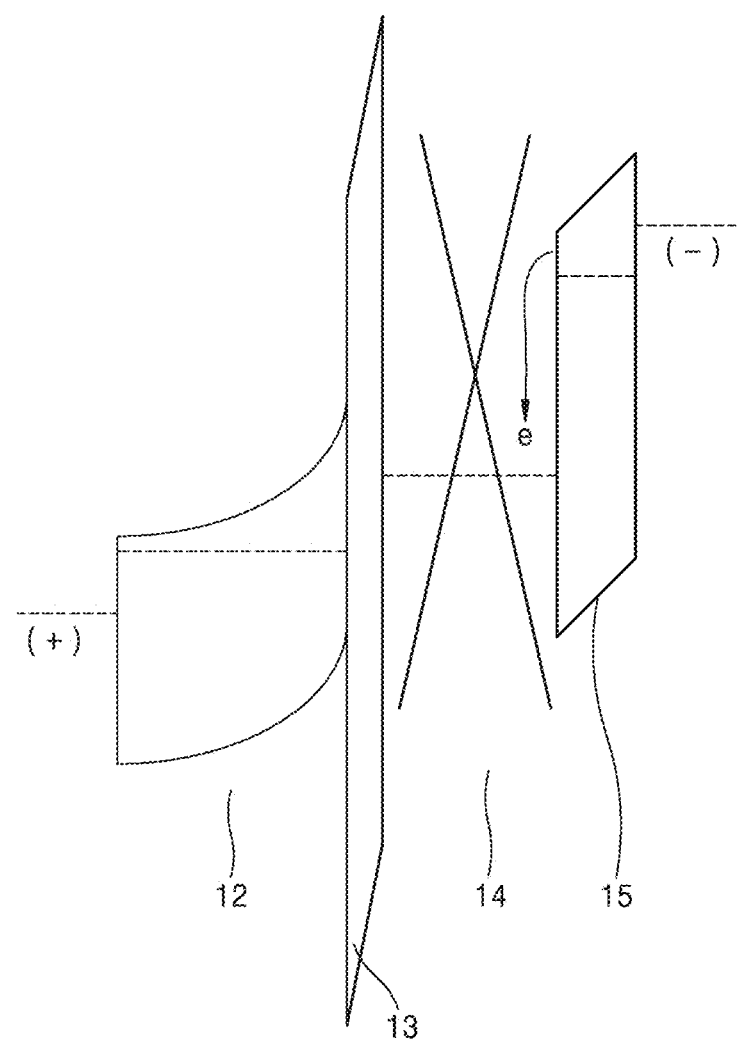
FIGS. 3A and 3B are schematic energy band diagrams illustrating operations of the avalanche photodetectors of FIGS. 1 and 2.
Figure 3B:
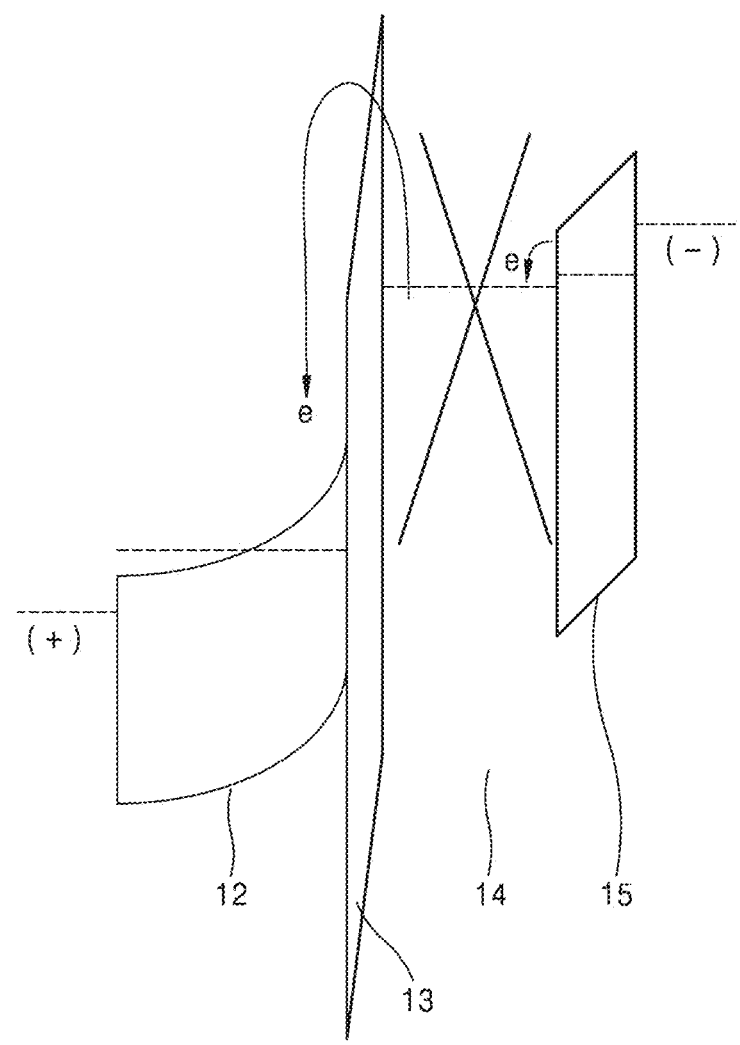

FIGS. 3A and 3B are schematic energy band diagrams illustrating operations of the avalanche photodetectors 10 of FIGS. 1 and 2. In detail, FIG. 3A is an energy band diagram when light is not incident on the avalanche photodetector 10. FIG. 3B is an energy band diagram when light is incident on the avalanche photodetector 10. In FIGS. 3A and 3B, a broken line marked on each layer in a horizontal direction represents a Fermi energy level of each layer. The energy band diagrams of FIGS. 3A and 3B represent cases in which a reverse bias is applied to the avalanche photodetectors 10. For example, the energy band diagrams of FIGS. 3A and 3B represent cases in which a positive (+) voltage is applied to the lower electrode 11 and a negative (−) voltage is applied to the upper electrode 16.

First, referring to FIG. 3A, the tunnel barrier layer 13 forms a very high energy barrier between the collector layer 12 and the emitter layer 15. In response to light being not incident on the avalanche photodetector 10, carriers emitted from the upper electrode 16 (e.g., electrons emitted when a negative (−) voltage is applied to the upper electrode 16) may be reflected from the emitter layer 15. Even when the carriers reach the graphene layer 14 through tunnel conduction, the movement of the carriers (e.g., electrons) from the graphene layer 14 to the collector layer 12 is limited due to an energy difference between the Fermi energy level of the graphene layer 14 and a conduction band of the tunnel barrier layer 13. Accordingly, dark current may be effectively suppressed.

Referring to FIG. 3B, in response to light being incident on the avalanche photodetector 10, electrons and holes are generated at the emitter layer 15. For example, in response to a positive (+) voltage being applied to the lower electrode 11 and a negative (−) voltage being applied to the upper electrode 16, the holes move to the upper electrode 16 and the electrons move to the graphene layer 14. Thus, as a large number of electrons are accumulated in the graphene layer 14, the Fermi energy level of the graphene layer 14 increases and the same effect in response to a voltage being applied between the graphene layer 14 and the collector layer 12 may be achieved. Accordingly, an energy barrier between the graphene layer 14 and the tunnel barrier layer 13 is lower and narrower than the energy barrier between the graphene layer 14 and the tunnel barrier layer 13 of FIG. 3A and thus a field electron emission effect is very high. Thus, a large number of electrons move to the collector layer 12 via the tunnel barrier layer 13. Similarly, a large number of electrons generated in response to light being absorbed by the graphene layer 14 move to the collector layer 12. In this case, the electrons passing through the tunnel barrier layer 13 have sufficient energy owing to a high voltage applied to the tunnel barrier layer 13, and thus impact ionization occurs in the collector layer 12. Due to the impact ionization, the avalanche phenomenon occurs in which a large number of electrons and holes are newly generated, and thus, photoelectric current may be amplified.

As described above, the avalanche photodetector 10 according to some example embodiments may be configured to utilize the photo-doping effect of the graphene layer 14 and may thus have high detection efficiency with respect to both visible light and infrared rays (e.g., infrared wavelength spectra of light and visible wavelength spectra of light). Particularly, the avalanche photodetector 10 is configured to cause the avalanche phenomenon to occur even with a relatively low driving voltage, and may thus have high sensitivity with regard to low power consumption. Thus, noise may be decreased based on effectively suppressing dark current, thereby achieving a high signal-to-noise ratio. The avalanche phenomenon is a phenomenon occurring very quickly and thus the avalanche photodetectors 10 according to embodiments have a very short photo-response time. Furthermore, the avalanche photodetectors 10 according to embodiments may easily select a wavelength band of light that can be sensed according to the type of the semiconductor material of the emitter layer 15, and may be manufactured in a small size using a general semiconductor process.

FIGS. 4, 5, 6, 7, 8, 9, 10, 11, 12, and 13 are graphs showing effects of the avalanche photodetector 10 having the structure as described above.

Figure 4:
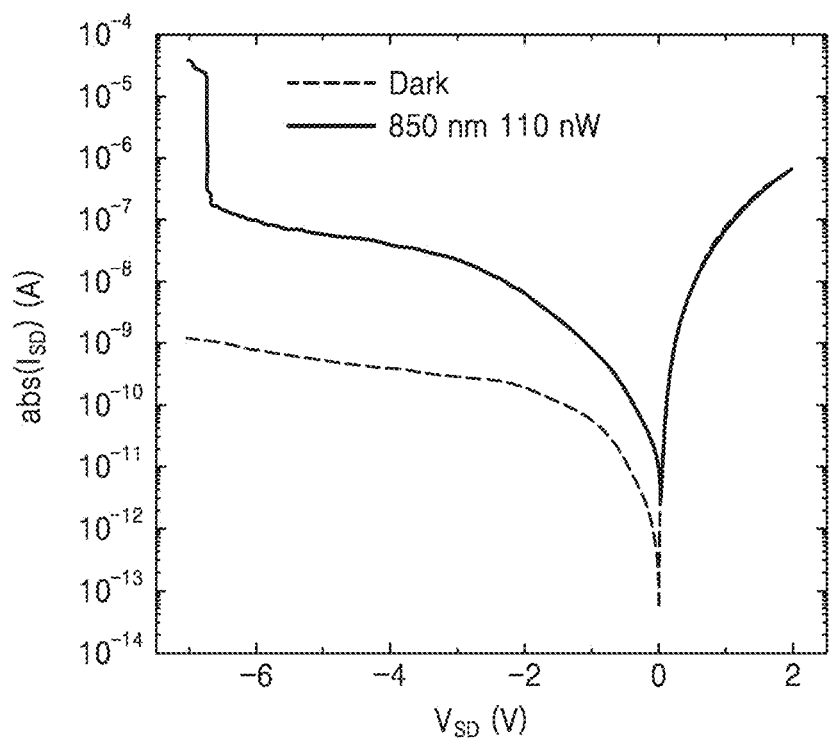
FIGS. 4, 5, and 6 are graphs showing effects of an avalanche photodetector having a graphene layer and an emitter layer which were formed by exfoliation.
Figure 5:
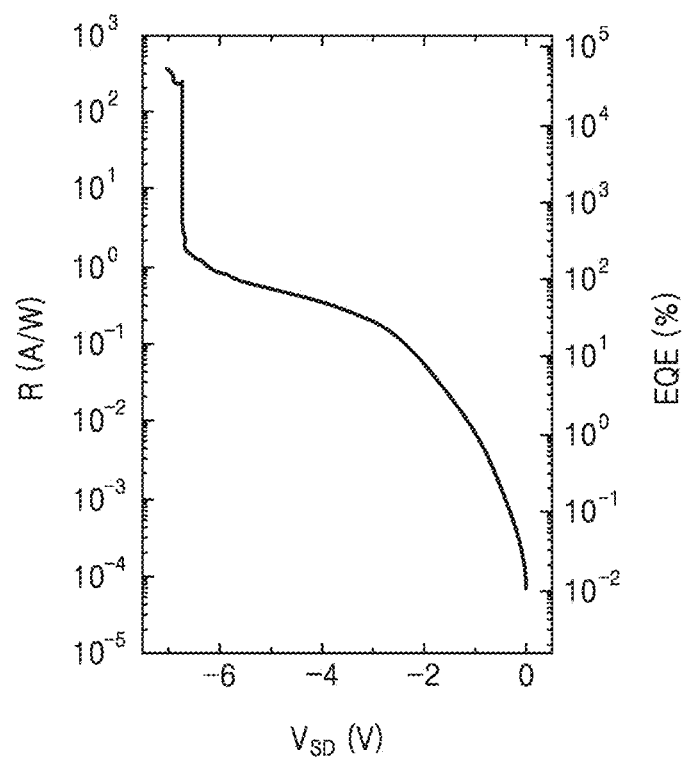
Figure 6:
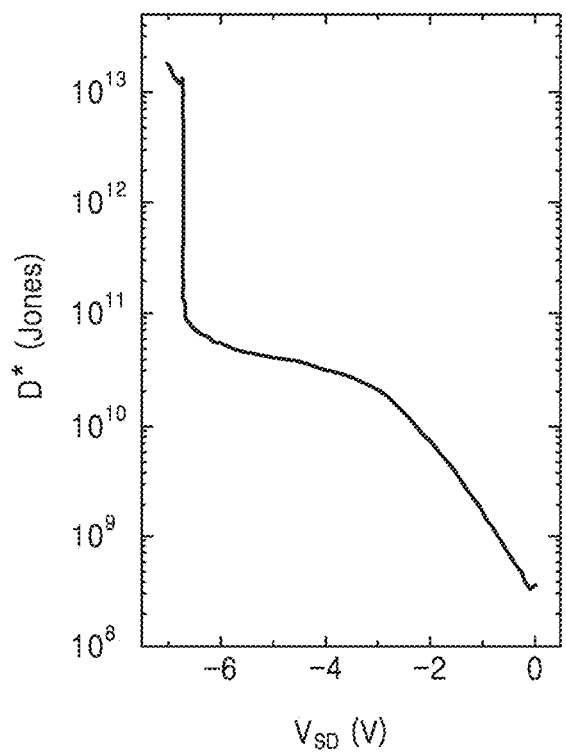

First, FIGS. 4, 5, and 6 are graphs showing effects of the avalanche photodetector 10 having the graphene layer 14 and the emitter layer 15 which were formed by exfoliation. Gold (Au) was used to form the lower electrode 11. n-doped silicon (n-Si) was used to form the collector layer 12. SiO2 was used to form the tunnel barrier layer 13. The graphene layer 14 was formed by stacking graphene, which was formed by exfoliation, in a multi-layer structure on the tunnel barrier layer 13. The emitter layer 15 was formed by stacking MoS2, which was formed by exfoliation, in a multi-layer structure on the graphene layer 14. Graphene was used to form the upper electrode 16. The tunnel barrier layer 13 had a thickness of about 5.6 nm, the graphene layer 14 had a thickness of about 17 nm, and the emitter layer 15 had a thickness of about 16.2 nm.

FIG. 4 is a graph showing a variation in dark current and photocurrent versus a voltage applied. Referring to FIG. 4, if light having a wavelength of about 850 nm which is a near-infrared region was incident at an intensity of about 110 nW, the avalanche phenomenon occurred when the applied voltage exceeded about −6 V. Thus, the photocurrent dramatically increased. In contrast, when light was not incident, the avalanche phenomenon did not occur. Thus dark current was not dramatically increased even when the applied voltage exceeded about −6 V. FIG. 5 is a graph showing a variation in responsivity R and external quantum efficiency EQE versus a voltage applied. Here, the responsivity R represents a ratio of the amount of photocurrent to the intensity of incident light. The external quantum efficiency EQE represents the number of electrons generated by the collector layer 12 per photon incident on the avalanche photodetector 10. As illustrated in FIG. 5, if light having a wavelength of about 850 nm was incident at an intensity of about 110 nW, the avalanche phenomenon occurred when the applied voltage exceeded about −6 V. Thus, R>100 A/W, and EQE>10000% were achieved. FIG. 6 is a graph showing a variation in specific detectivity D* versus a voltage applied. The specific detectivity D* represents responsivity measured when dark current and an area of a photosensitive region were taken into account. Referring to FIG. 6, the specific detectivity D* of 1013 Jones or more was obtained due to low dark current and high responsivity.

Figure 7:
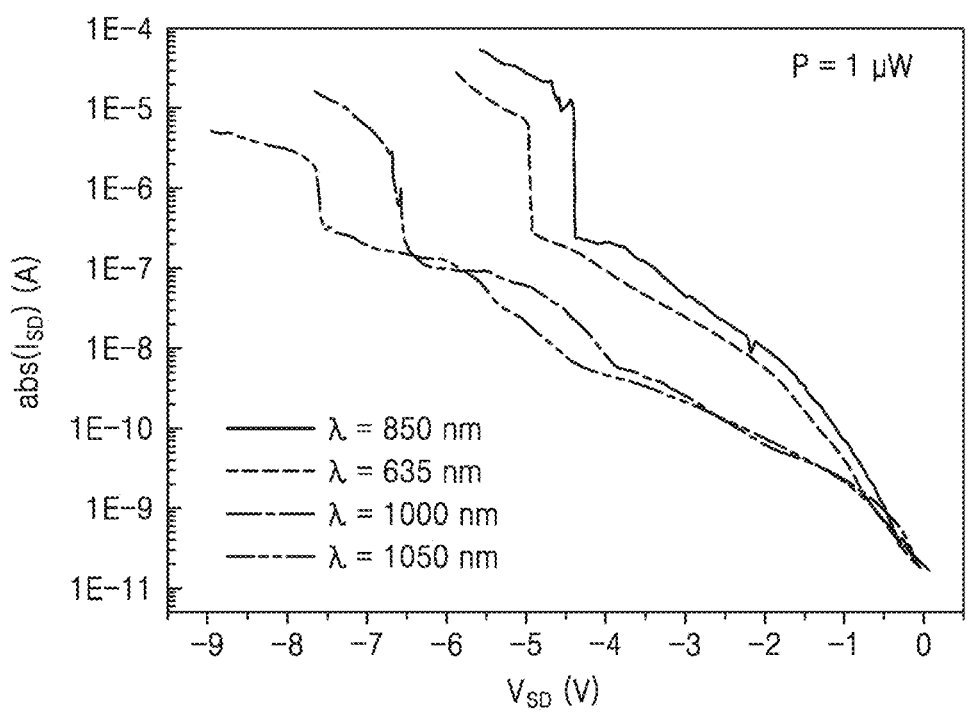
FIG. 7 is a graph showing photo-responsivity of an avalanche photodetector with respect to various wavelength bands.

FIG. 7 is a graph showing photo-responsivity of the avalanche photodetector 10 with respect to various wavelength bands. Referring to FIG. 7, a voltage at which the avalanche phenomenon occurred may slightly vary according to a wavelength band of incident light but high photocurrent was obtained at a wavelength band of visible light of 635 nm to infrared rays of 850 to 1050 nm due to the avalanche phenomenon.

Figure 8:
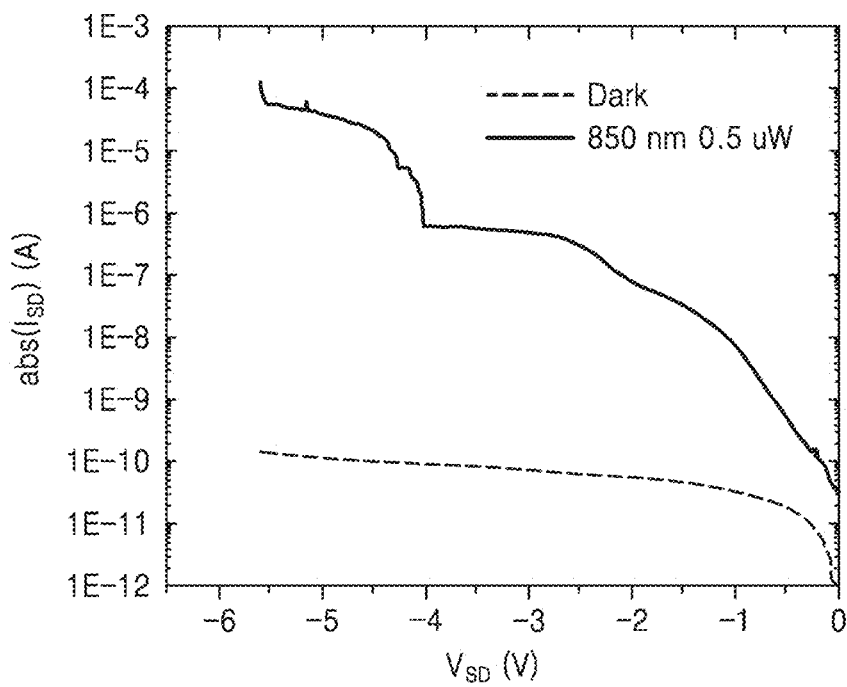
FIGS. 8, 9, 10, 11, 12, and 13 are graphs showing effects of an avalanche photodetector having a graphene layer and an emitter layer which were formed by direct growth.
Figure 9:
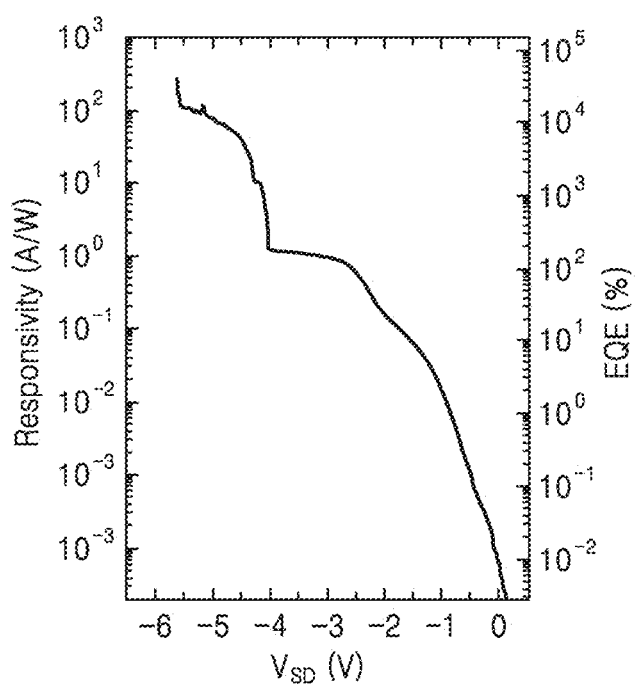
Figure 10:
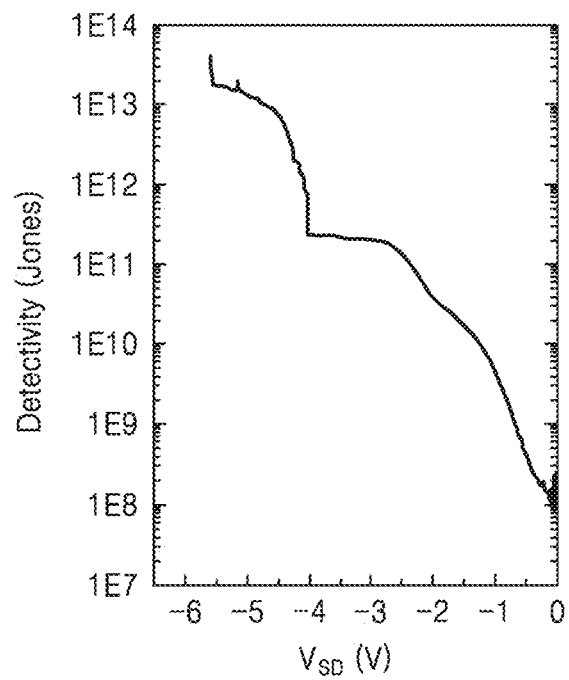

FIGS. 8, 9, and 10 are graphs showing effects of the avalanche photodetector 10 having the graphene layer 14 and the emitter layer 15 which were formed by direct growth or by transferring a direct grown material. Gold (Au) was used to form the lower electrode 11. n-doped silicon (n-Si) was used to form the collector layer 12. SiO2 was used to form the tunnel barrier layer 13. The graphene layer 14 was formed by directly growing graphene in a multilayer structure on the tunnel barrier layer 13 or transferring graphene onto the tunnel barrier layer 13. The emitter layer 15 was formed by directly growing MoS2 in a multilayer structure on the graphene layer 14 or transferring MoS2 onto the graphene layer 14. The upper electrode 16 was formed by directly growing or transferring graphene.

FIG. 8 is a graph showing a variation in dark current and photocurrent versus a voltage applied. Referring to FIG. 8, if light having a wavelength of about 850 nm which is a near-infrared region was incident at an intensity of about 0.5 uW, w the avalanche phenomenon occurred when the applied voltage exceeded about −4 V. Accordingly, the photocurrent dramatically increased. In contrast, when light was not incident, the avalanche phenomenon did not occur. Thus, dark current did not dramatically increase when the applied voltage exceeded about −4 V. FIG. 9 is a graph showing a variation in responsivity R and EQE versus a voltage applied. Referring to FIG. 9, if light having a wavelength of about 850 nm was incident at an intensity of about 0.5 uW, the avalanche phenomenon occurred when the applied voltage exceeded about −4 V. Thus, R>100 A/W, and EQE>10000% were achieved. FIG. 10 is a graph showing a variation in specific detectivity D* versus a voltage applied. Referring to FIG. 10, the specific detectivity D* of 1013 Jones or more was achieved.

Figure 11:
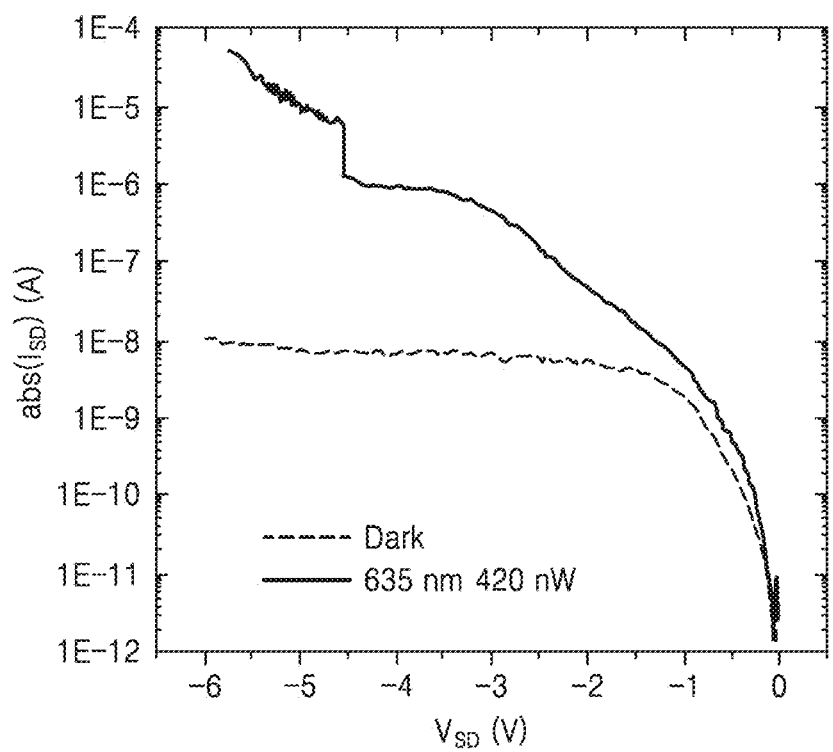
Figure 12:
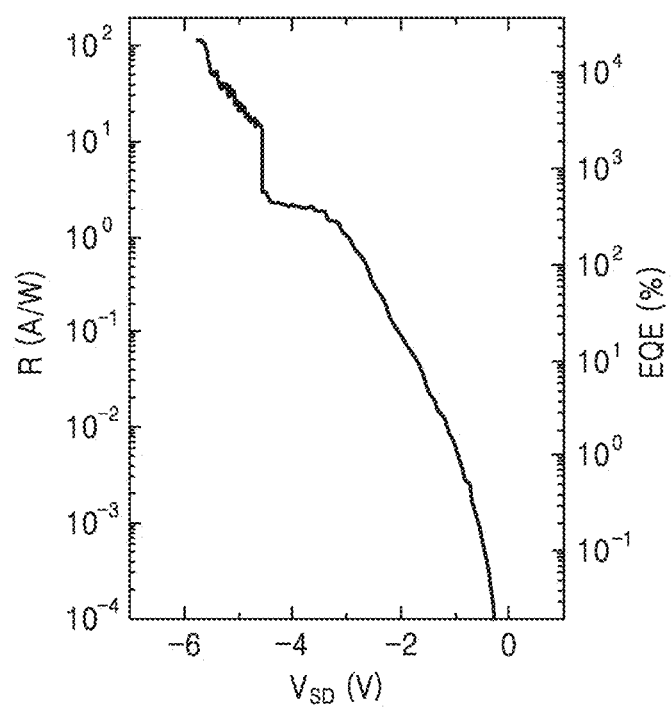
Figure 13:
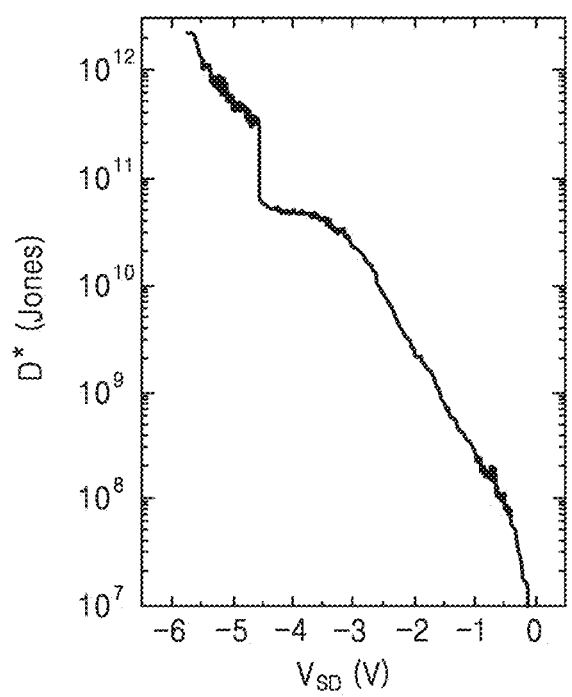

FIGS. 11, 12, and 13 are graphs showing effects of the avalanche photodetector 10 having the graphene layer 14 and the emitter layer 15 which were formed by direct growth or by transferring a direct growth material. In the graphs of FIGS. 11 to 13, the avalanche photodetector 10 is the same as the avalanche photodetector 10 described above with reference to FIGS. 8 to 10 in terms of components thereof but is different from the avalanche photodetector 10 described above with reference to FIGS. 8 to 10 in terms of a wavelength and intensity of incident light. FIGS. 11 to 13 were obtained by emitting light having a wavelength of about 635 nm which is a visible light region to be incident on the avalanche photodetector 10 at an intensity of about 420 nW.

FIG. 11 is a graph showing a variation in dark current and photocurrent versus a voltage applied. Referring to FIG. 11, if light having a wavelength of about 635 nm which is a visible light region was incident at an intensity of about 420 nW, the avalanche phenomenon occurred and the photocurrent dramatically increased when the applied voltage exceeded about −4.5 V. In contrast, if light was not incident, the avalanche phenomenon did not occurred and thus dark current did not dramatically increase. FIG. 12 is a graph showing a variation in responsivity R and external quantum efficiency EQE versus a voltage applied. Referring to FIG. 12, when light having a wavelength of about 635 nm was incident at an intensity of about 420 nW, the avalanche phenomenon occurred and R>100 A/W and EQE>10000% were achieved when the applied voltage exceeded about −4.5 V. FIG. 13 is a graph showing a variation in a specific detectivity D* versus a voltage applied. Referring to FIG. 13, a specific detectivity D* of 1012 Jones or more may be achieved.

The avalanche photodetector 10 described above is applicable to ("may be included in") biometric sensors, low light sensitivity enhancement equipment, night glasses, a Light Detection and Ranging (LiDAR) system, 3D sensors, etc. Furthermore, the avalanche photodetector 10 is applicable to ("may be included in one or more") image sensors configured to generate both a visible-light image and an infrared ray image.

Figure 14:
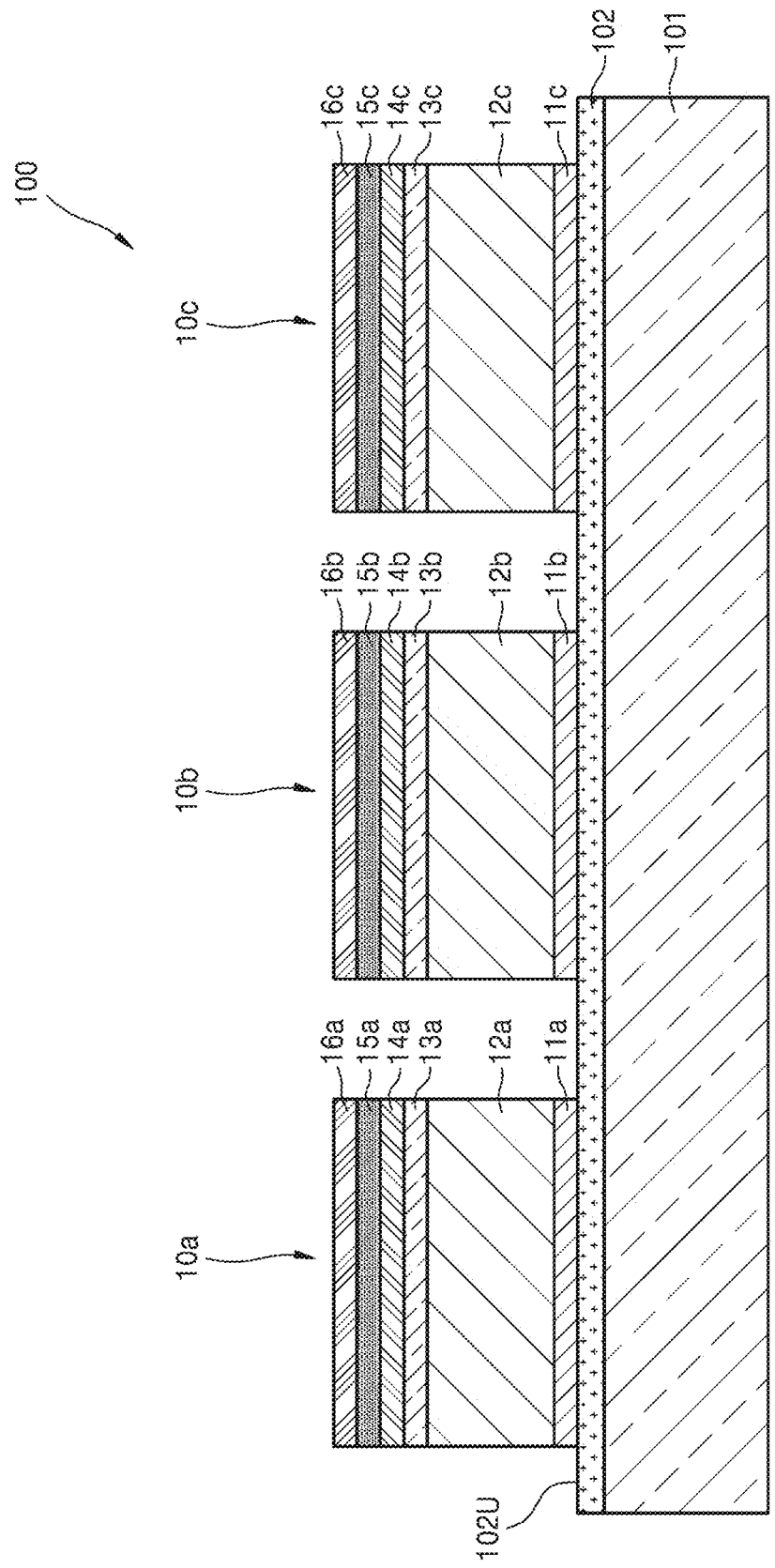
FIG. 14 is a schematic cross-sectional view of an image sensor according to some example embodiments.
Figure 15:
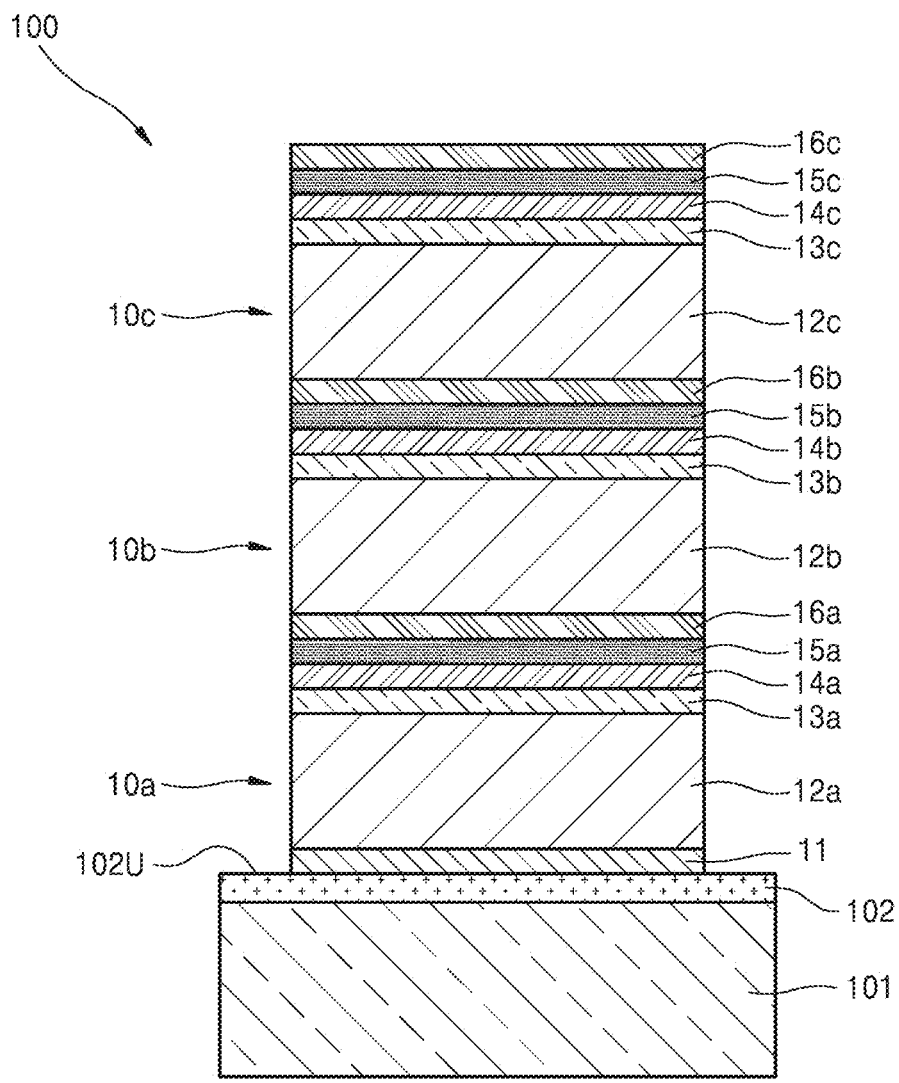
FIG. 15 is a schematic cross-sectional view of an image sensor according to some example embodiments.
Figure 16:
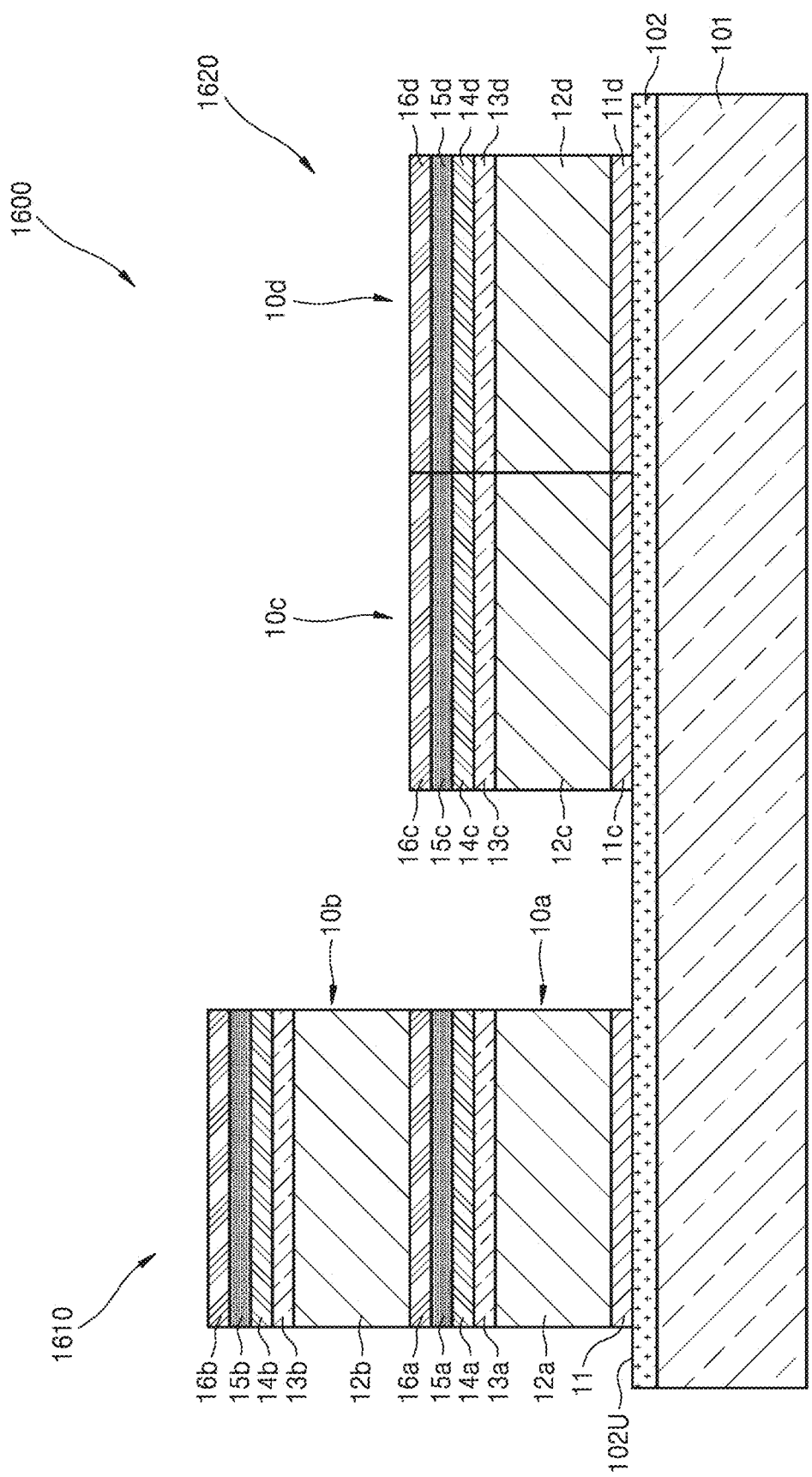
FIG. 16 is a schematic cross-sectional view of an image sensor according to some example embodiments.

Referring now to FIGS. 14-16 in general, an image sensor may include a substrate 101, an insulating layer 102 on the substrate 101, and a plurality of avalanche photodetectors 10a, 10b, 10c, 10d on the insulating layer 102. As described in further detail below with reference to FIG. 14, the avalanche photodetectors 10, 10b, and 10c may be separately on the insulating layer 102 and may be aligned (either in direct contact with each other or isolated from direct contact with each other) in a direction that is parallel to a top surface 102U of the insulating layer 102. As described in further detail below with reference to FIG. 15, the avalanche photodetectors 10, 10b, and 10c may be aligned on the insulating layer 102 in a direction that is perpendicular to a top surface 102U of the insulating layer 102. As described in further detail below with reference to FIG. 16, an image sensor may include a mixture of avalanche photodetectors aligned with each other in a direction extending in parallel to the top surface 102U of the insulating layer 102 and avalanche photodetectors aligned with each other in a direction extending perpendicular to the top surface 102U of the insulating layer 102.

For example, FIG. 14 is a schematic cross-sectional view of an image sensor 100 according to some example embodiments. Referring to FIG. 14, the image sensor 100 according to some example embodiments may include a substrate 101, an insulating layer 102 disposed on the substrate 101, and a plurality of avalanche photodetectors 10a, 10b, and 10c disposed on the insulating layer 102, such that the avalanche photodetectors 10, 10b, and 10c are separately on the insulating layer 102 and are isolated from direct contact with each other in a direction that is parallel to a top surface 102U of the insulating layer 102. The substrate 101 may be a semiconductor substrate, a glass substrate, or a flexible plastic substrate. Although not particularly shown, a circuit may be included in the substrate 101 to input or output data. A general insulating material such as SiO2, SiN, Al2O3, or HfO2 may be used to form the insulating layer 102.

Each of the avalanche photodetectors 10a, 10b, and 10c may have the structure described above with reference to FIG. 1 or 2. For example, the first avalanche photodetector 10a may include a first lower electrode 11a disposed on the insulating layer 102, a first collector layer 12a disposed on the first lower electrode 11a, a first tunnel barrier layer 13a disposed on the first collector layer 12a, a first graphene layer 14a disposed on the first tunnel barrier layer 13a, a first emitter layer 15a disposed on the first graphene layer 14a, and a first upper electrode 16a disposed on the first emitter layer 15a. The second avalanche photodetector 10b may include a second lower electrode 11b disposed on the insulating layer 102, a second collector layer 12b disposed on the second lower electrode 11b, a second tunnel barrier layer 13b disposed on the second collector layer 12b, a second graphene layer 14b disposed on the second tunnel barrier layer 13b, a second emitter layer 15b disposed on the second graphene layer 14b, and a second upper electrode 16b disposed on the second emitter layer 15b. The third avalanche photodetector 10c may include a third lower electrode 11c disposed on the insulating layer 102, a third collector layer 12c disposed on the third lower electrode 11c, a third tunnel barrier layer 13c disposed on the third collector layer 12c, a third graphene layer 14c disposed on the third tunnel barrier layer 13c, a third emitter layer 15c disposed on the third graphene layer 14c, and a third upper electrode 16c disposed on the third emitter layer 15c.

The first to third avalanche photodetectors 10a, 10b, and 10c may form one pixel of the image sensor 100. Each of the first to third avalanche photodetectors 10a, 10b, and 10c may function as a subpixel for detecting light having a specific wavelength. To this end, the first emitter layer 15a, the second emitter layer 15b, and the third emitter layer 15c may be formed of ("may include") semiconductor materials having different band gaps, respectively. In some example embodiments, the first to third emitter layers 15a, 15b, and 15c may be formed of the same semiconductor material (e.g., a common semiconductor material) to be configured to detect light having a wide wavelength band (e.g., a relatively wide wavelength spectrum of light), and a color filter may be further provided on a plane of light incidence of each of the first to third avalanche photodetectors 10a, 10b, and 10c. Although FIG. 14 illustrates the three avalanche photodetectors 10a, 10b, and 10c, four or more avalanche photodetectors may be used according to a wavelength band to be detected.

FIG. 15 is a schematic cross-sectional view of an image sensor 200 according to some example embodiments. Referring to FIG. 15, the image sensor 200 may include a substrate 101, an insulating layer 102 disposed on the substrate 101, a lower electrode 11 (e.g., "first electrode") disposed on the insulating layer 102, a first avalanche photodetector 10a disposed on the lower electrode 11, a second avalanche photodetector 10b disposed on the first avalanche photodetector 10a, and a third avalanche photodetector 10c disposed on the second avalanche photodetector 10b. Thus, the image sensor 200 of FIG. 15 may be a stack type image sensor in which the plurality of the avalanche photodetectors 10a, 10b, and 10c are stacked in a vertical direction (e.g., are aligned in a direction extending perpendicular to a top surface 102U of insulating layer 102).

Each of the avalanche photodetectors 10a, 10b, and 10c may have the structure described above with reference to FIG. 1 or 2 except the lower electrode 11. For example, the first avalanche photodetector 10a may include a first collector layer 12a disposed on the lower electrode 11, a first tunnel barrier layer 13a disposed on the first collector layer 12a, a first graphene layer 14a disposed on the first tunnel barrier layer 13a, a first emitter layer 15a disposed on the first graphene layer 14a, and a first upper electrode 16a disposed on the first emitter layer 15a. The second avalanche photodetector 10b may include a second collector layer 12b disposed on the first upper electrode 16a, a second tunnel barrier layer 13b disposed on the second collector layer 12b, a second graphene layer 14b disposed on the second tunnel barrier layer 13b, a second emitter layer 15b disposed on the second graphene layer 14b, and a second upper electrode 16b disposed on the second emitter layer 15b. The third avalanche photodetector 10c may include a third collector layer 12c disposed on the second upper electrode 16b, a third tunnel barrier layer 13c disposed on the third collector layer 12c, a third graphene layer 14c disposed on the third tunnel barrier layer 13c, a third emitter layer 15c disposed on the third graphene layer 14c, and a third upper electrode 16c disposed on the third emitter layer 15c.

All of the first to third upper electrodes 16a, 16b, and 16c may be transparent electrodes. Here, the first upper electrode 16a may function as an upper electrode of the first avalanche photodetector 10a and a lower electrode of the second avalanche photodetector 10b. The second upper electrode 16b may function as an upper electrode of the second avalanche photodetector 10b and a lower electrode of the third avalanche photodetector 10c. In this structure, when the image sensor 200 is operated, a lowest voltage may be applied to the third upper electrode 16c, and increasingly higher voltages may be applied to the second upper electrode 16b, the first upper electrode 16a, and the lower electrode 11, respectively, in this stated order. For example, a voltage difference between the third upper electrode 16c and the second upper electrode 16b, a voltage difference between the second upper electrode 16b and the first upper electrode 16a, and a voltage difference between the first upper electrode 16a and the lower electrode 11 may be respectively higher than a voltage of the first avalanche photodetector 10a at which the avalanche phenomenon occurs, a voltage the second avalanche photodetector 10b at which the avalanche phenomenon occurs, and a voltage of the third avalanche photodetector 10c at which the avalanche phenomenon occurs.

As described above with reference to FIG. 14, the first to third avalanche photodetectors 10a, 10b, and 10c of the image sensor 200 may form one pixel of the image sensor 200. Each of the first to third avalanche photodetectors 10a, 10b, and 10c may function as a subpixel for detecting light having a specific wavelength. To this end, the first emitter layer 15a, the second emitter layer 15b, and the third emitter layer 15c may be formed of semiconductor materials having different band gaps, respectively. In some example embodiments, although not shown in FIG. 15, a color filter may be provided ("located") between the first upper electrode 16a and the second collector layer 12b and between the second upper electrode 16b and the third collector layer 12c.

FIG. 16 is a schematic cross-sectional view of an image sensor according to some example embodiments.

Referring to FIG. 16, the image sensor 1600 according to some example embodiments may include a substrate 101, an insulating layer 102 disposed on the substrate 101, and a plurality of sets of avalanche photodetectors 10a, 10b, 10c, and 10d disposed on the insulating layer 102.

As shown in FIG. 16, the first set 1610 of avalanche photodetectors includes avalanche photodetectors 10a and 10b which are aligned with each other on the insulating layer 102 in a direction that extends perpendicular to the top surface 102U of the insulating layer 102. For example, set 1610 includes a lower electrode 11 (e.g., "first electrode") disposed on the insulating layer 102, a first avalanche photodetector 10a disposed on the lower electrode 11, and a second avalanche photodetector 10b disposed on the first avalanche photodetector 10a. Thus, set 1610 may provide a stack type image sensor element in which the plurality of the avalanche photodetectors 10a and 10b are stacked in a vertical direction (e.g., are aligned in a direction extending perpendicular to a top surface 102U of insulating layer 102).

As further shown in FIG. 16, the second set 1620 of avalanche photodetectors includes avalanche photodetectors 10c and 10d which are separately on the insulating layer 102 and are aligned with each other in a direction that is parallel to a top surface 102U of the insulating layer 102. As shown in FIG. 16, the avalanche photodetectors 10c and 10d may be in direct contact with each other in the direction that is parallel to the top surface 102U of the insulating layer 102, but the avalanche photodetectors 10c and 10d may be isolated from direct contact with each other.

Each of the avalanche photodetectors 10c, and 10d may have the structure described above with reference to FIG. 1 or 2. For example, the third avalanche photodetector 10c may include a third lower electrode 11c disposed on the insulating layer 102, a third collector layer 12c disposed on the third lower electrode 11c, a third tunnel barrier layer 13c disposed on the third collector layer 12c, a third graphene layer 14c disposed on the third tunnel barrier layer 13c, a third emitter layer 15c disposed on the third graphene layer 14c, and a third upper electrode 16c disposed on the third emitter layer 15c. The fourth avalanche photodetector 10d may include a fourth lower electrode 11d disposed on the insulating layer 102, a fourth collector layer 12d disposed on the fourth lower electrode 11d, a fourth tunnel barrier layer 13d disposed on the fourth collector layer 12d, a fourth graphene layer 14d disposed on the fourth tunnel barrier layer 13d, a fourth emitter layer 15d disposed on the fourth graphene layer 14d, and a fourth upper electrode 16d disposed on the fourth emitter layer 15d.

The first and second sets 1610 and 1620 of photodetectors form one pixel or separate pixels of the image sensor 1600. The first set 1610 of photodetectors may function similarly to the image sensor illustrated in FIG. 15, and the second set 1620 of photodetectors may function similarly to the image sensor illustrated in FIG. 14.

As described above, the avalanche photodetector 10 described above is applicable to ("may be included in") LiDAR systems. A LiDAR system including the avalanche photodetector 10 described above may be configured to provide ("generate") images having improved accuracy and sensitivity (e.g., "resolution") and may further have improved compactness (e.g., a smaller form factor). In addition, based on including the avalanche photodetector 10, a LiDAR system may have improved compactness (e.g., smaller size) and thus may be included in smaller devices and/or may be configured to be fabricated and/or operated with reduced costs (e.g., fabrication costs, operating costs, etc.). A LiDAR system may be incorporated into a device that utilizes the images generated by the LiDAR system to perform a function. As a result, based on including a LiDAR system that includes the avalanche photodetector 10 described above, a device may be able to perform a function, based on utilizing images generated by the LiDAR system, with improved effectiveness, efficiency, accuracy, some combination thereof, or the like. In addition, based on including a LiDAR system having improved compactness (e.g., smaller form factor, smaller size, etc.), the device (e.g., a vehicle) may be associated with reduced fabrication and/or operating costs.

Figure 17:
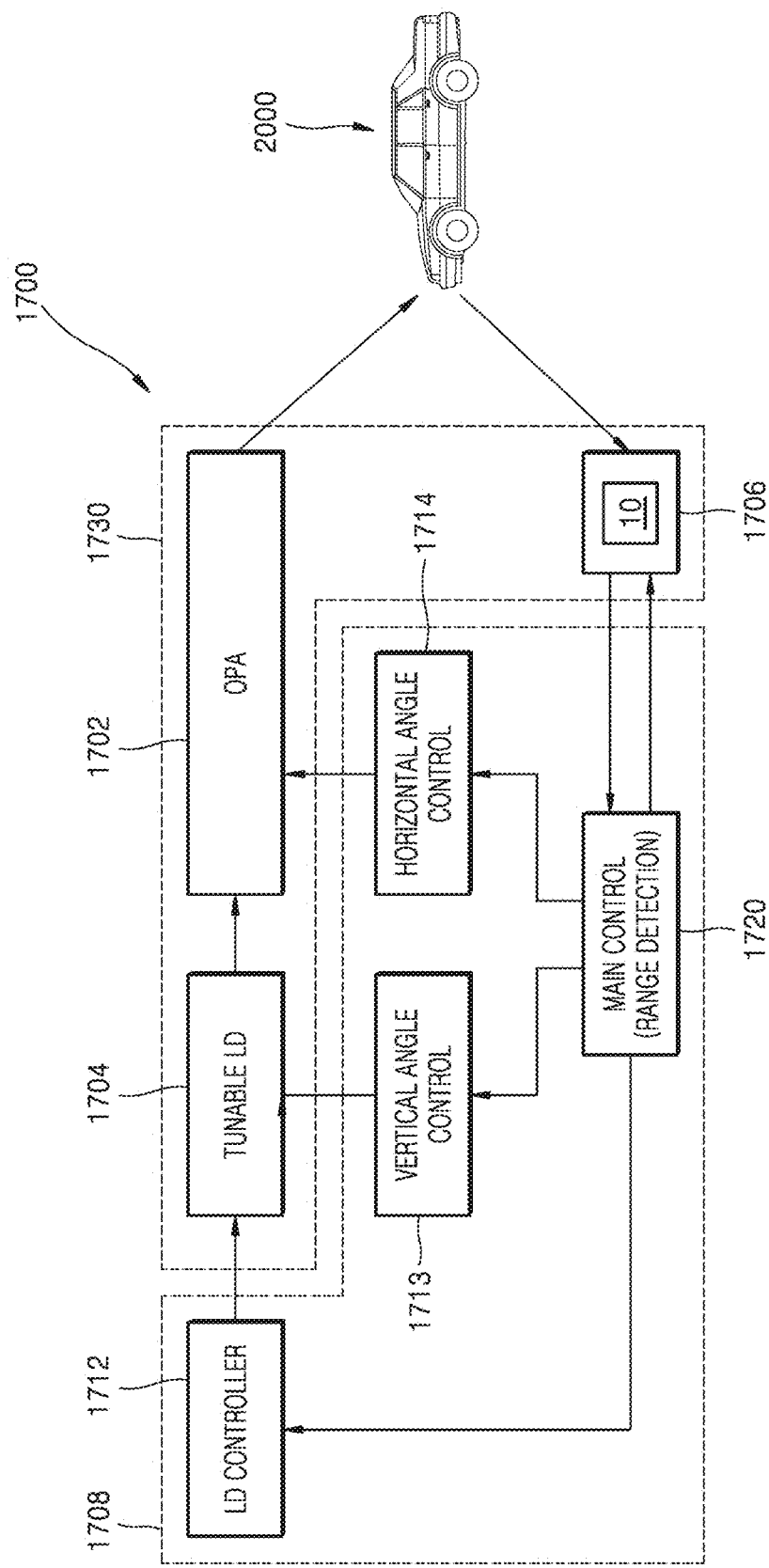
FIG. 17 is a diagram illustrating a configuration of a LiDAR system according to some example embodiments.

FIG. 17 is a diagram illustrating a configuration of a LiDAR system 1700 including the avalanche photodetector 10 according to some example embodiments. Referring to FIG. 17, the LiDAR system 1700 according to some example embodiments may include a wavelength-tunable laser diode (LD) 1704 configured to emit a light beam, an optical phased array (OPA) 1702 configured to receive the emitted light beam as an input optical signal and output an optical signal into an environment external to the LiDAR system 1700 based on receiving the input optical signal from the LD 1704, a receiver 1706, and a controller 1708. As shown in FIG. 12, at least the receiver 1706 may include one or more avalanche photodetectors 10. The OPA 1702 may include an antenna array (not shown in FIG. 17). The OPA 1702 may equally split the optical signal from the wavelength-tunable LD 1704 to N channels based on performing a branch operation M times and outputting the split optical signal in one or more particular directions through a set of antennas corresponding to the N channels, (M being an integer equal to or greater than 1, N being equal to $2^M$).

As shown in FIG. 17, in some example embodiments, one or more LiDAR systems 1700 may be included in one or more portions of a vehicle 2000, including an automobile. The vehicle 2000 may include a vehicle that is configured to be driven ("navigated") manually (e.g., based on manual interaction with one or more driving instruments of the vehicle 2000 by at least one occupant of the vehicle 2000), a vehicle that is configured to be driven ("navigated") autonomously (e.g., an autonomous vehicle configured to be driven based on at least partial computer system control of the vehicle 2000 with or without input from vehicle 2000 occupant(s)), some combination thereof, or the like.

For example, in some example embodiments, the vehicle 2000 may be configured to be driven ("navigated") through an environment based on generation of data by one or more LiDAR systems 1700 included in the vehicle 2000. Such navigation may include the vehicle 2000 being configured to navigate through an environment, in relation to an object located in the environment, based at least in part on data generated by the LiDAR system as a result of the LiDAR system emitting a laser beam into the environment and detecting the object in the environment, where the LiDAR system may detect the object based on detecting a reflection and/or scattering of the emitted laser beam off of the object.

In some example embodiments, based on the receiver 1706 including an avalanche photodetector 10, the LiDAR system 1700 may enable a vehicle 2000 to be configured to implement autonomous navigation of an environment, via incorporation of a LiDAR system 1700 that includes the avalanche photodetector 10, with improved efficiency, reliability, effectiveness, accuracy, some combination thereof, or the like, thereby enabling improved environment monitoring to further enable autonomous navigation through the environment.

In the LiDAR system 1700 according to some example embodiments, the receiver 1706 may be formed so as to include a plurality of photodiodes arranged as an array structure.

The controller 1708 may include an LD controller 1712, a vertical angle controller 1713, a horizontal angle controller 1714, and a main controller 1720. The LD controller 1712 controls light output from the LD 1704. For example, the LD controller 1712 may control a power supply to the LD 1704, switching on/off of the LD 1704, and the generation of Pulse Waves (PWs) or Continuous Waves (CWs) of the LD 1704.

The vertical angle controller 1713 may control a vertical angle of an optical signal output from the OPA 1702 by adjusting a wavelength or a frequency of output light from the LD 1704. The horizontal angle controller 1714 may control a horizontal angle of an optical signal output from the OPA 1702 by adjusting the OPA 1702. When the OPA 1702 is adjusted, it may mean that a phase of an optical signal is adjusted. When a phase of an optical signal is shifted, a direction in which the optical signal is output from the OPA 1702 (e.g., an antenna of the OPA 1702), for example, a horizontal angle of the optical signal, may be changed.

The main controller 1720 may control overall operations of the LD controller 1712, the vertical angle controller 1713, the horizontal angle controller 1714, and the receiver 1706. Also, the main controller 1720 may receive information about an optical signal reflected from the receiver 1706 and may calculate a distance to an object. For example, the main controller 1720 may calculate a distance to an object by using a time of flight (TOF) technology.

The TOF technology is a technology for measuring a distance to an object by using a signal such as near-infrared rays, ultrasonic waves, or a laser. In detail, the TOF technology calculates a distance by measuring a time difference between when a signal is emitted to an object and when the signal is reflected from the object. In the TOF technology, since a transmitter applies a signal and a receiver receives a signal reflected from an object to measure a travel time of the signal, the transmitter and the receiver may be slightly spaced apart from each other in one device. Also, since the signal from the transmitter may affect the receiver, a shielding film may be between the transmitter and the receiver.

The transmitter sends an optical signal modulated at a specific frequency f, and the receiver detects an optical signal reflected from an object. A phase change due to a time taken for the optical signal to travel to and from the object may be detected, and a distance to the object may be calculated as shown in Equation 1.

$$D=c/(2f)*(n+\theta/(2\pi)) \quad (1)$$

In Equation 1, D may be a distance of measurement, c may be a speed of light, f may be a frequency of an optical signal, n may be a constant when a phase cycle is repeated, and θ may be a phase of the received optical signal.

When a maximum value of the distance of measurement D is determined and the constant n is assumed to be 0, the distance of measurement D may be defined by using Equation 2.

$$D=c\theta/(4\pi f) \quad (2)$$

In the LiDAR system 1700 according to some example embodiments, the OPA 1702, the LD 1704, and the receiver 1706 may be integrated together in a bulk-silicon substrate. In FIG. 17, the OPA 1702, the LD 1704, and the receiver 1706 are together surrounded by a dashed line in order to indicate that the OPA 1702, the LD 1704, and the receiver 1706 are integrated in a common bulk-silicon substrate. An arrangement of the OPA 1702, the LD 1704, and the receiver 1706, integrated together in the bulk-silicon substrate, may correspond to an optical integrated circuit 1730.

In the controller 1708, the LD controller 1712, the vertical angle controller 1713, the horizontal angle controller 1714, and the main controller 1720 may each be formed as one chip (e.g., a separate chip coupled to the optical integrated circuit 1730), or may be integrated together into one chip. Accordingly, a dashed line marking the controller 1708 may not indicate that the LD controller 1712, the vertical angle controller 1713, the horizontal angle controller 1714, and the main controller 1720 are integrated together, but may indicate that the LD controller 1712, the vertical angle controller 1713, the horizontal angle controller 1714, and the main controller 1720 are included as elements in the controller 1708. If necessary, the controller 1708 may be integrated in the bulk-silicon substrate of the optical integrated circuit 1730.

While avalanche photodetectors and image sensors including the same have been described above with reference to the embodiments illustrated in the drawings, they are merely examples and it will be apparent to those of ordinary skill in the art that various changes may be made therein and equivalent embodiments may be implemented. Thus, the embodiments set forth herein should be considered in a descriptive sense only and not for purposes of limitation. Accordingly, it should be understood that the scope of the present disclosure is defined not in the above description but in the appended claims, and all modifications falling within a range equivalent to the scope of the present disclosure are included in the scope of the present disclosure.

What is claimed is:

1. A light detection and ranging (LiDAR) system, comprising:
   a wavelength-tunable laser diode (LD) configured to emit a light beam;
   an optical phased array (OPA) configured to receive the emitted light beam as an input optical signal and output an optical signal into an environment based on receiving the input optical signal from the LD;
   a receiver configured to receive an optical signal output from the OPA and reflected from an object; and
   a controller configured to control the wavelength-tunable LD, the OPA, and the receiver,
   wherein the receiver includes at least one photodetector, the at least one photodetector including:
   a first electrode;
   a collector layer on the first electrode;
   a tunnel barrier layer on the collector layer;
   a graphene layer on the tunnel barrier layer;
   an emitter layer on the graphene layer; and
   a second electrode on the emitter layer,
   wherein the collector layer includes a first semiconductor material and the emitter layer includes a second semiconductor material,
   wherein at least one semiconductor material of the first semiconductor material and the second semiconductor material includes a transition metal dichalcogenide that is a compound of a transition metal and a chalcogen element that is one of S, Se, or Te,
   wherein the emitter layer has a thickness of about 0.3 nm to about 1 μm such that the emitter layer absorbs light and moves electrons and holes, and
   wherein the tunnel barrier layer has a thickness of about 0.3 nm to about 1 μm.

2. The LiDAR system of claim 1, wherein the first electrode at least partially includes a conductive metal material.

3. The LiDAR system of claim 1, wherein the transition metal dichalcogenide includes at least one selected from a group consisting of $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$.

4. The LiDAR system of claim 1, wherein the tunnel barrier layer includes an insulating material, the insulating material having a thickness that is at least a minimum thickness of the insulating material associated with tunneling of electrons and holes in the tunnel barrier layer.

5. The LiDAR system of claim 1, wherein the tunnel barrier layer includes at least one material selected from a group consisting of $SiO_2$ and SiN.

6. The LiDAR system of claim 1, wherein
the graphene layer includes single-layer graphene or multi-layer graphene, and
the graphene layer has a thickness of about 0.3 nm to about 1 μm.

7. The LiDAR system of claim 1, wherein an energy of the tunnel barrier layer in a conduction band is higher than an energy of the collector layer and an energy of the emitter layer in a conduction band.

8. The LiDAR system of claim 1, wherein the emitter layer is configured to absorb light and generate electron-hole pairs.

9. The LiDAR system of claim 1, wherein,
the LiDAR system is configured to be included in a vehicle, such that the LiDAR system is configured to enable the vehicle to be autonomously navigated in relation to the object based at least in part upon data generated by the LiDAR system.

10. The LiDAR system of claim 1, wherein the controller includes,
an LD controller configured to control light emitted by the wavelength-tunable LD;
a vertical angle controller configured to control a vertical angle of the optical signal based on adjusting a wavelength of the wavelength-tunable LD;
a horizontal angle controller configured to control a horizontal angle of the optical signal based on adjusting the OPA; and
a main controller configured to control the LD controller, the vertical angle controller, the horizontal angle controller, and the receiver.

11. The LiDAR system of claim 1, wherein the wavelength-tunable LD, the OPA, and the receiver are integrated in a bulk-silicon substrate, such that the wavelength-tunable LD, the OPA, and the receiver collectively comprise an optical integrated circuit.

12. The LiDAR system of claim 11, wherein the controller is one of
a device integrated in the bulk-silicon substrate, and
a separate chip coupled to the optical integrated circuit.

* * * * *